United States Patent
Tani et al.

(10) Patent No.: US 9,439,279 B2
(45) Date of Patent: Sep. 6, 2016

(54) CERAMIC CIRCUIT BOARD AND ELECTRONIC DEVICE

(71) Applicant: NGK INSULATORS, LTD., Nagoya (JP)

(72) Inventors: Makoto Tani, Inazawa (JP); Yoshihiro Tanaka, Nagoya (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 141 days.

(21) Appl. No.: 14/457,429

(22) Filed: Aug. 12, 2014

(65) Prior Publication Data

US 2015/0049442 A1 Feb. 19, 2015

(30) Foreign Application Priority Data

Aug. 16, 2013 (JP) .................................. 2013-169261

(51) Int. Cl.
- *H05K 1/00* (2006.01)
- *H05K 1/02* (2006.01)
- *H05K 1/11* (2006.01)
- *H01L 23/367* (2006.01)
- *H01L 23/373* (2006.01)
- *C04B 37/02* (2006.01)
- *H05K 1/03* (2006.01)

(52) U.S. Cl.
CPC .......... *H05K 1/0204* (2013.01); *C04B 37/026* (2013.01); *H01L 23/367* (2013.01); *H01L 23/3735* (2013.01); *H05K 1/111* (2013.01); *C04B 2237/124* (2013.01); *C04B 2237/125* (2013.01); *C04B 2237/127* (2013.01); *C04B 2237/368* (2013.01); *C04B 2237/407* (2013.01); *C04B 2237/704* (2013.01); *C04B 2237/706* (2013.01); *C04B 2237/708* (2013.01); *C04B 2237/86* (2013.01); *H01L 2924/0002* (2013.01); *H05K 1/0306* (2013.01)

(58) Field of Classification Search
CPC .................. H01L 2924/0002; H01L 2924/00; H01L 23/367; H01L 23/3735; C04B 2237/124; C04B 2237/125; C04B 2237/368; C04B 2237/407; C04B 2237/70; C04B 2237/86; C04B 37/026; H05K 1/0204; H05K 1/0306
USPC ........ 361/748, 704, 720, 707, 709; 174/252, 174/255, 258–260
See application file for complete search history.

(56) References Cited

U.S. PATENT DOCUMENTS

| | | | |
|---|---|---|---|
| 8,223,498 B2 * | 7/2012 | Lima .................. | H05K 7/20418 361/704 |
| 2005/0258550 A1 * | 11/2005 | Morita ................ | H01L 21/4871 257/784 |
| 2014/0057131 A1 | 2/2014 | Osanai et al. | |
| 2015/0208496 A1 * | 7/2015 | Terasaki .................. | B23K 35/30 361/760 |
| 2015/0223317 A1 * | 8/2015 | Oi .......................... | H05K 1/181 361/709 |
| 2015/0257252 A1 * | 9/2015 | Kato .................... | H01L 23/3735 257/773 |
| 2015/0366048 A1 * | 12/2015 | Nagase ................. | H05K 1/0203 174/252 |

FOREIGN PATENT DOCUMENTS

| | | |
|---|---|---|
| EP | 1 511 075 A2 | 3/2005 |
| JP | 2003-309210 A1 | 10/2003 |
| JP | 3847954 B2 | 11/2006 |
| WO | 2012/127695 A1 | 9/2012 |
| WO | 2013/163993 A1 | 11/2013 |

OTHER PUBLICATIONS

Extended European Search Report (Application No. 14160453.8) dated Dec. 5, 2014.

* cited by examiner

*Primary Examiner* — Yuriy Semenenko

(74) *Attorney, Agent, or Firm* — Burr & Brown, PLLC

(57) ABSTRACT

A ceramic circuit board includes a ceramic substrate, and a first metal plate bonded to a front surface of the ceramic substrate. A size of the front surface of the ceramic substrate is smaller than a size of a surface, i.e., a first facing surface, on a side of the first metal plate that faces the ceramic substrate.

4 Claims, 4 Drawing Sheets

CERAMIC CIRCUIT BOARD AND ELECTRONIC DEVICE

CROSS-REFERENCE TO RELATED APPLICATION

This application is based upon and claims the benefit of priority from Japanese Patent Application No. 2013-163261 filed on Aug. 16, 2013, the contents of which are incorporated herein by reference.

BACKGROUND OF THE INVENTION

1. Field of the Invention

The present invention relates to a ceramic circuit board and an electronic device, and in particular, relates to a ceramic circuit board, which is suitable for use as an insulating substrate for a power semiconductor, for example, of a bipolar transistor, a power MOSFET (metal-oxide-semiconductor field-effect transistor), an IGBT (Insulated Gate Bipolar Transistor) or the like, as well as to an electronic device utilizing such a ceramic circuit board.

2. Description of the Related Art

In recent years, for example as shown in FIG. 3A, a ceramic circuit board 100 having a first metal plate 104 on a front surface 102a of a ceramic substrate 102, and a second metal plate 106 on a rear surface 102b of the ceramic substrate 102, has been used as an insulating substrate for a power semiconductor (for example, see Japanese Patent No. 3847954). In addition, an electronic device 112 may be constituted by mounting a power semiconductor 108 through a bonding layer 110, for example, such as solder or the like, on the first metal plate 104, as shown in FIG. 3B.

In the ceramic circuit board 100 on which the power semiconductor 108 is mounted, for suppressing generation of heat, a high heat dissipation property is required. Accordingly, in general, for use as the first metal plate 104 and the second metal plate 106, metal plates that exhibit high thermal conductivity, including Cu (copper) and Al (aluminum), are selected. For the ceramic substrate 102, a ceramic substrate that exhibits high thermal conductivity, such as AlN (aluminum nitride) or $Si_3N_4$ (silicon nitride), is selected. A heat dissipating substrate, in which the aforementioned materials are bonded directly or are bonded through a brazing material, is used as a ceramic circuit board 100.

In particular, with the ceramic circuit board 100, in which a first metal plate 104 and a second metal plate 106 constituted from Cu, and a ceramic substrate 102 constituted from $Si_3N_4$ are joined through a brazing material, due to the ceramic, which possesses high strength, and Cu, which exhibits high thermal conductivity, the ceramic circuit board 100 is superior in terms of heat cycle characteristics and thus can be utilized advantageously. Further, a heat sink, for example, may be bonded to an end surface of the second metal plate 106.

SUMMARY OF THE INVENTION

Incidentally, recently, needs have arisen for miniaturization and an improvement in power density of the power semiconductor 108, or to simplify a cooling system thereof by improving heat dissipation. If the power density of the power semiconductor 108 is enhanced, the amount of heat generated thereby increases, and if the cooling system is simplified, heat dissipation thereof tends to decrease. Therefore, to be responsive to the aforementioned needs, there has been a demand for further improvements in heat dissipation characteristics for the ceramic circuit board 100.

Thus, as a method for improving heat dissipation, for example as shown in FIG. 4, it may be considered to increase the thicknesses tb of the first metal plate 104 and the thickness tb of the second metal plate 106, so as to be greater in thickness than the thicknesses tb according to the conventional technique (see FIG. 3A).

Ordinarily, in the case that the ceramic circuit board 100 according to the conventional technique shown in FIG. 3A is used, in accordance with the heat cycle thereof during usage, thermal stress accompanying the difference in thermal expansion between the first metal plate 104 and the ceramic substrate 102 is generated at an interface 114a between the first metal plate 104 and the ceramic substrate 102. In this case, on the front surface 102a of the ceramic substrate 102, a mixed state is brought about between the aforementioned interface 114a to which thermal stress is applied, and portions in the vicinity thereof to which thermal stress is not applied. Similarly, thermal stress accompanying the difference in thermal expansion between the second metal plate 106 and the ceramic substrate 102 is generated at an interface 114b between the second metal plate 106 and the ceramic substrate 102. In this case as well, on the rear surface 102b of the ceramic substrate 102, a mixed state is brought about between the aforementioned interface 114b to which thermal stress is applied, and portions in the vicinity thereof to which thermal stress is not applied.

Accordingly, as shown in FIG. 4, if the thickness tb of the first metal plate 104 and the thickness tb of the second metal plate 106 are increased, due to the fact that the first metal plate 104 and the second metal plate 106 become greater in volume, thermal stresses, which are generated at the interface 114a between the first metal plate 104 and the ceramic substrate 102 as well as at the interface 114b between the second metal plate 106 and the ceramic substrate 102, also increase. For this reason, as a result of the heat cycle during usage, there is a concern over problems such as cracks 116 occurring in the ceramic substrate 102 or splitting of the ceramic substrate 102.

More specifically, due to the heat cycle during usage, within the front surface of the ceramic substrate 102, a concern exists that cracks 116 will be introduced from a border portion, where compressive stresses and tensile stresses are concentrated at the border between the interface where thermal stress is applied and portions in the vicinity thereof where thermal stress is not applied.

In this manner, with the ceramic circuit board 100 according to the conventional technique, a problem exists in that an improvement in heat dissipation cannot be realized, and thus the aforementioned needs cannot be responded to.

The present invention has been made in order to address the aforementioned problems, and has the object of providing a ceramic circuit board and an electronic device, which can suppress compressive stresses and tensile stresses that accompany thermal stress in a ceramic substrate, even in the case that a metal plate, which is provided at least on a side on which a power semiconductor is mounted, is increased in thickness, which can suppress the occurrence of warping, and in which heat dissipation characteristics can be enhanced.

[1] A ceramic circuit board according to a first aspect of the present invention comprises a ceramic substrate, and a metal plate bonded to a front surface of the ceramic substrate, wherein a size of the front surface of the ceramic substrate is smaller than a size of a surface on a side of the metal plate that faces the ceramic substrate.

Owing to the above structure, because the metal plate is bonded on the ceramic substrate, due to the heat cycle during usage, thermal stress accompanying a difference in thermal expansion between the metal plate and the ceramic substrate is generated at an interface between the metal plate and the ceramic substrate. At this time, since the entire surface of the ceramic substrate acts as the interface, a boundary between a portion where thermal stress is applied and a portion where thermal stress is not applied ceases to exist. More specifically, from the fact that portions cease to exist where compressive stresses and tensile stresses are applied concentratively accompanying the thermal stress, concentration of stresses at the ceramic substrate also vanish, so that cracks or splitting of the ceramic substrate due to the heat cycle during usage do not occur. Consequently, the thickness of the metal plate can be made greater than the thickness of the ceramic substrate, and heat dissipation properties of the ceramic circuit board can be enhanced.

[2] In the first aspect of the present invention, the ceramic substrate and the metal plate (hereinafter referred to as a first metal plate) may be bonded together, such that an entirety of the front surface of the ceramic substrate is included within the surface on the side of the first metal plate that faces the ceramic substrate, preferably. Consequently, since the entire surface of the ceramic substrate acts as the aforementioned interface, with certainty, the boundary between a portion where thermal stress is applied and a portion where thermal stress is not applied ceases to exist.

[3] In the first aspect of the present invention, a second metal plate may be bonded to a rear surface of the ceramic substrate, and a size of the rear surface of the ceramic substrate may be larger than a size of a surface on a side of the second metal plate that faces the ceramic substrate, preferably.

Concerning the rigidity of the ceramic circuit board, the rigidity of the large sized first metal plate is dominant, and therefore, even if the thickness of the second metal plate is made less than the thickness of the ceramic substrate, warping of the ceramic circuit board overall can be suppressed, and cracking or breaking off of the mounted power semiconductor, or the occurrence of cracks in a bonding layer of solder or the like can be avoided. Consequently, the distance from the ceramic substrate to the heat sink can be shortened, an improvement in heat dissipation can be achieved, and an advantage is brought about in that the ceramic circuit board can be made thin or low in profile.

In addition, by appropriately adjusting the size of the rear surface of the ceramic substrate and the size of the surface on the second metal plate that faces the ceramic substrate, a distance required to achieve electrical isolation can easily be set in order to satisfy a creepage distance, which is defined by the operating voltage, the degree of contamination, or the like, whereby the occurrence of creeping discharge can be avoided.

[4] In this case, the second metal plate preferably is bonded within the rear surface of the ceramic substrate at a position where the entire surface of the second metal plate that faces the ceramic substrate is included.

[5] Further, a thickness of the first metal plate preferably is greater than a thickness of the second metal plate. Consequently, the distance from the ceramic substrate to a cooling device (e.g., a heat sink) can be shortened, an improvement in heat dissipation can be achieved, and an advantage is brought about in that the ceramic circuit board can be made thin or low in profile.

[6] In this case, an inequality $t2<ta<t1$ may be satisfied, where ta represents the thickness of the ceramic substrate, t1 represents the thickness of the first metal plate, and t2 represents the thickness of the second metal plate.

[7] An electronic device according to a second aspect of the present invention includes a ceramic circuit board according to the aforementioned first aspect of the present invention, and a power semiconductor, which is mounted on a surface of the first metal plate of the ceramic circuit board.

As described above, in accordance with the electronic device and the ceramic circuit board according to the present invention, compressive stresses and tensile stresses accompanying thermal stress in the ceramic substrate can be suppressed, even in the case that a metal plate, which is provided at least on a side on which a power semiconductor is mounted, is increased in thickness.

Together therewith, the occurrence of warping can be suppressed, and heat dissipation can be enhanced.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE INVENTION

Below, preferred embodiments of the ceramic circuit board according to the present invention will be described with reference to FIGS. 1A through 2B. In the present specification, the dash symbol "-" (or "to") shown in connection with numerical ranges implies that the numerical values appearing before and after the dash symbol include upper limit and lower limit values.

Figure 1A:
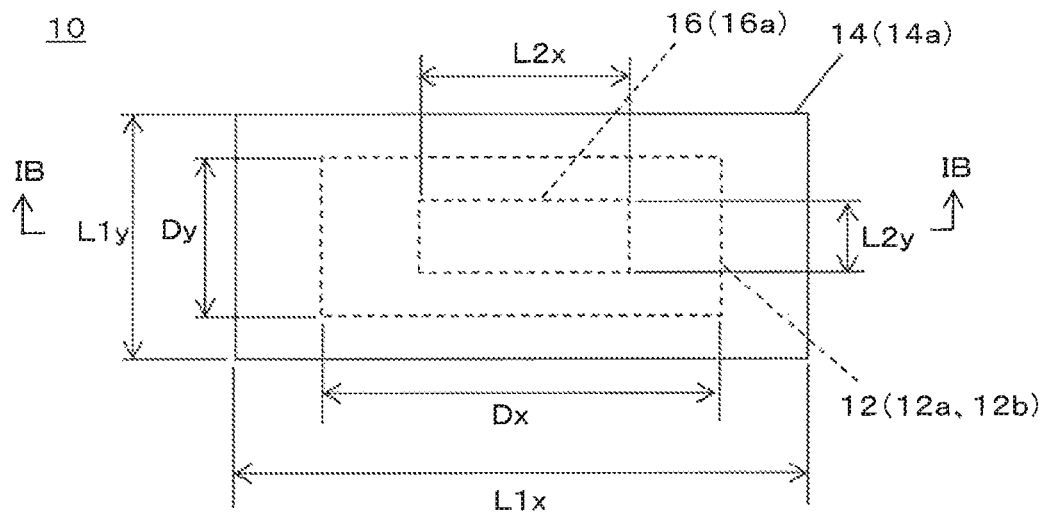
FIG. 1A is a plan view showing a ceramic circuit board as viewed from an upper surface thereof according to an embodiment of the present invention.
Figure 1B:
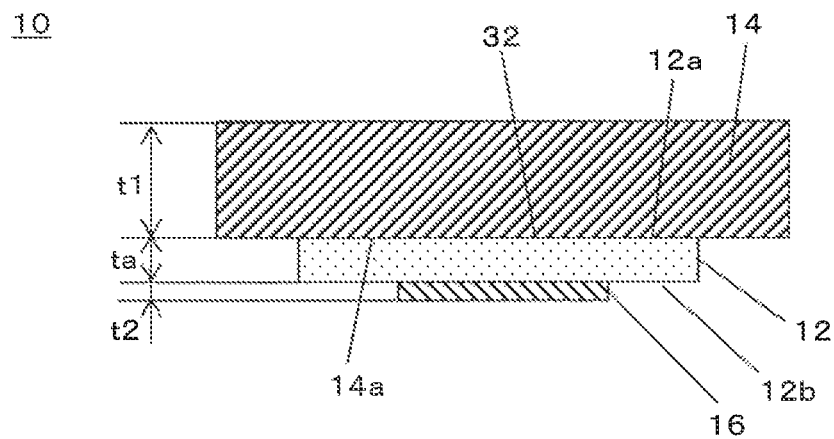
FIG. 1B is a cross-sectional view taken along line IB-IB in FIG. 1A.

As shown in FIGS. 1A and 1B, a ceramic circuit board 10 according to a first embodiment of the present invention includes a ceramic substrate 12, a first metal plate 14 bonded to a front surface 12a of the ceramic substrate 12, and a second metal plate 16 bonded to a rear surface 12b of the ceramic substrate 12. Various shapes may be used for the respective outer shapes of the ceramic substrate 12, the first metal plate 14, and the second metal plate 16, although as viewed from the upper surface thereof in FIG. 1B, rectangular shapes are shown, respectively.

The first metal plate 14 and the second metal plate 16 can be made up from metal plates that exhibit high thermal conductivity, including Cu and Al. The ceramic substrate 12 can be made up from a ceramic substrate that exhibits high thermal conductivity, such as AlN or $Si_3N_4$. Concerning the bond between the first metal plate 14 and the ceramic substrate 12, and the bond between the second metal plate 16 and the ceramic substrate 12, direct bonding, or bonding through a brazing material may be used. As a brazing material, a brazing material with an active metal added thereto, such as Ti (titanium) or the like, can be used.

In addition, concerning the ceramic circuit board 10, a size of the front surface 12a of the ceramic substrate 12 is smaller than a size of a surface (hereinafter referred to as a "first facing surface 14a") on a side of the first metal plate 14 that faces the ceramic substrate 12, and greater than a size of a surface (hereinafter referred to as a "second facing surface 16a") on a side of the second metal plate 16 that faces the ceramic substrate 12. The "front surface 12a of the ceramic substrate 12" is defined by a surface (e.g., the upper surface shown in FIG. 1B) bonded to the first metal plate 14 on which a power semiconductor 26 (see FIG. 2A) is mounted, whereas the "rear surface" thereof is defined by a surface (e.g., the lower surface shown in FIG. 1B) opposite from the front surface 12a.

More specifically, the length Dy in the vertical direction and the length Dx in the horizontal (traverse) direction as viewed from the upper surface of the ceramic substrate 12 are shorter than the length L1y in the vertical direction and the length L1x in the horizontal direction of the first metal plate 14, and longer than the length L2y in the vertical direction and the length L2x in the horizontal direction of the second metal plate 16.

Further, in the bond between the ceramic substrate 12 and the first metal plate 14, as viewed from the upper surface, portions of the ceramic substrate 12 do not protrude from the first metal plate 14, and the ceramic substrate 12 and the first metal plate 14 are bonded such that the entirety of the front surface 12a of the ceramic substrate 12 is included within the first facing surface 14a of the first metal plate 14. Similarly, in the bond between the ceramic substrate 12 and the second metal plate 16, as viewed from the upper surface, portions of the second metal plate 16 do not protrude from the ceramic substrate 12, and the ceramic substrate 12 and the second metal plate 16 are bonded such that the entirety of the second facing surface 16a of the second metal plate 16 is included within the rear surface 12b of the ceramic substrate 12.

Concerning the respective outer shapes of the ceramic substrate 12, the first metal plate 14, and the second metal plate 16, apart from the aforementioned rectangular shapes, other shapes such as circular shapes, elliptical shapes, track-like shapes, and various polygonal shapes such as triangles, pentagons, hexagons, or the like can be used.

Further, in the ceramic circuit board 10, the following inequality is satisfied:

$$t2 < ta < t1$$

where ta represents the thickness of the ceramic substrate 12, t1 represents the thickness of the first metal plate 14, and t2 represents the thickness of the second metal plate 16.

Figure 2A:
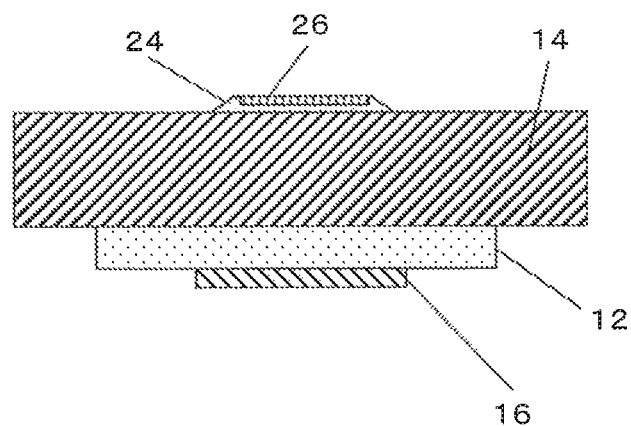
FIG. 2A is a vertical cross-sectional view showing an electronic device according to the present embodiment.
Figure 2B:
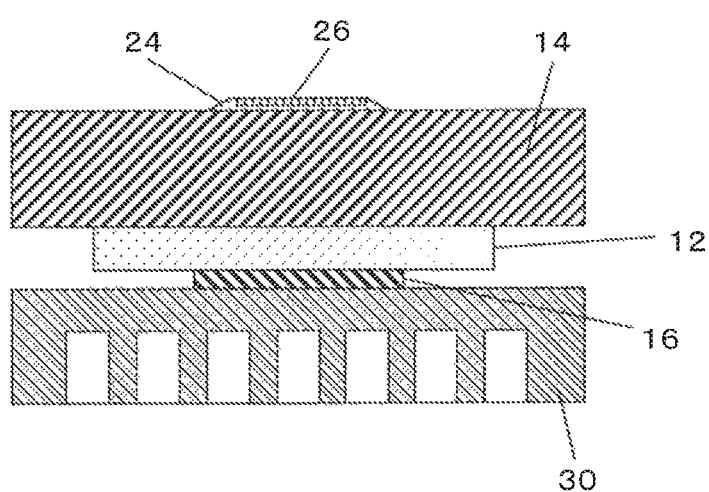
FIG. 2B is a vertical cross-sectional view showing another example of the electronic device.

In addition, as shown in FIG. 2A, the power semiconductor 26 is mounted through a bonding layer 24 of solder or the like to the front surface of the first metal plate 14, whereby an electronic device 28 is made up according to the embodiment of the present invention. As shown in FIG. 2B, it is a matter of course that the electronic device 28 may also be constituted by further bonding a heat sink 30 to an end surface of the second metal plate 16. Moreover, in FIGS. 2A and 2B, although the height of the power semiconductor 26 is illustrated, for example, as being thinner than the thickness of the ceramic substrate 12, the invention is not limited to this feature.

In the ceramic circuit board 10, because the first metal plate 14 is bonded on the ceramic substrate 12, due to the heat cycle during usage, thermal stress accompanying a difference in thermal expansion between the first metal plate 14 and the ceramic substrate 12 is generated at an interface 32 (see FIG. 1) between the first metal plate 14 and the ceramic substrate 12.

At this time, since the entire front surface 12a of the ceramic substrate 12 acts as the interface 32, a boundary between a portion where thermal stress is applied and a portion where thermal stress is not applied ceases to exist. More specifically, from the fact that portions cease to exist where compressive stresses and tensile stresses are applied concentratively accompanying the thermal stress, concentration of stresses at the ceramic substrate 12 also vanish, so that cracks or splitting of the ceramic substrate 12 due to the heat cycle during usage do not occur. Consequently, the thickness t1 of the first metal plate 14 can be made greater than the thickness ta of the ceramic substrate 12, and the heat dissipation properties can be enhanced.

Further, from the fact that the size of the first facing surface 14a of the first metal plate 14 is larger than the size of the front surface 12a of the ceramic substrate 12, in relation to the rigidity of the ceramic circuit board 10, the rigidity of the first metal plate 14, which is larger in size, is dominant. Of course, if the thickness t1 of the first metal plate 14 is greater than the thickness ta of the ceramic substrate 12, it follows that the rigidity of the first metal plate 14 is dominant. Therefore, even if the thickness t2 of the second metal plate 16 is smaller than the thickness ta of the ceramic substrate 12, the occurrence of warping of the ceramic circuit board 10 overall is suppressed, the occurrence of cracks or breaking off of the mounted power semiconductor 26, and the occurrence of cracks in the bonding layer 24 can be avoided. Consequently, the distance from the ceramic substrate 12 to the heat sink 30 can be shortened, an improvement in heat dissipation can be achieved, and an advantage is brought about in that the ceramic circuit board 10 can be made thin or low in profile.

In addition, by appropriately adjusting the size of the rear surface 12b of the ceramic substrate 12 and the size of the second facing surface 16a on the second metal plate 16, a distance required to achieve electrical isolation can easily be set in order to satisfy a creepage distance, which is defined by the operating voltage, the degree of impurities, or the like, whereby the occurrence of creeping discharge can be avoided. Further, with this example, the distance required to achieve electrical isolation is a minimal distance along the ceramic substrate 12 (insulator) between the first metal plate 14 (conductor) and the second metal plate 16 (conductor).

In the foregoing manner, in the ceramic circuit board 10 and the electronic device 28, compressive stresses and tensile stresses accompanying thermal stress in the ceramic substrate 12 can be suppressed, even in the case that the first metal plate 14, which is provided at least on a side on which the power semiconductor 26 is mounted, is increased in thickness. In addition, since the occurrence of warping can be suppressed, heat dissipation can be enhanced, and the device can advantageously be made smaller in scale.

EXAMPLES

An evaluation as to the presence or absence of cracks in the bonding layer 24 and the ceramic substrate 12 was performed with respect to Inventive Example 1 and Comparative Examples 1 and 2. The results of this evaluation are shown in Table 1, which will be discussed below.

For the ceramic substrate 12, a square-shaped (vertical and horizontal sides=30 mm×30 mm) board of silicon nitride ($Si_3N_4$) was prepared having a thickness of 0.3 mm with a bending (flexural) strength of 650 MPa. For the first metal plate 14 and the second metal plate 16, oxygen-free copper (Cu) plates were prepared. Further, an Ag—Cu (silver/copper) type brazing material paste, to which there was added a Ti active metal powder, was prepared.

Example 1

A ceramic circuit board for evaluation according to Example 1 included a structure similar to that of the ceramic circuit board 10 shown in FIGS. 1A and 1B.

At first, a brazing material was coated at a thickness of 10 μm on the ceramic substrate 12, and the Cu plates (the first metal plate 14 and the second metal plate 16) were bonded with the ceramic substrate 12. The first metal plate 14 was square-shaped as viewed from above, with a size in which the vertical and horizontal sides thereof were 35 mm×35 mm, and the thickness t1 thereof was 2 mm. The second metal plate 16 was square-shaped as viewed from above, with a size in which the vertical and horizontal sides thereof were 25 mm×25 mm, and the thickness t2 thereof was 0.1 mm.

The bonding conditions were such that heated pressure bonding was carried out under a vacuum at a temperature of 800° C. and a pressure of 1 MPa. Thereafter, as shown in FIG. 2A, a power semiconductor 26 was bonded through a bonding layer 24 (in this case, a solder layer) to thereby obtain an evaluation sample according to Example 1. Ten of such evaluation samples were prepared.

Comparative Example 1

Figure 3A:
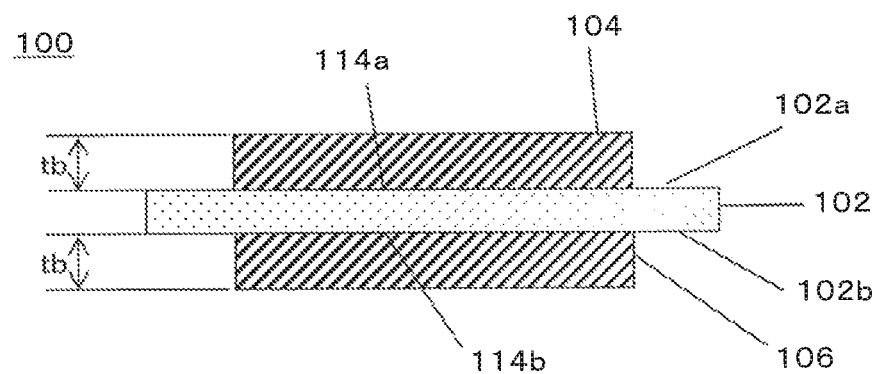
FIG. 3A is a vertical cross-sectional view showing a ceramic circuit board according to a conventional technique.
Figure 3B:
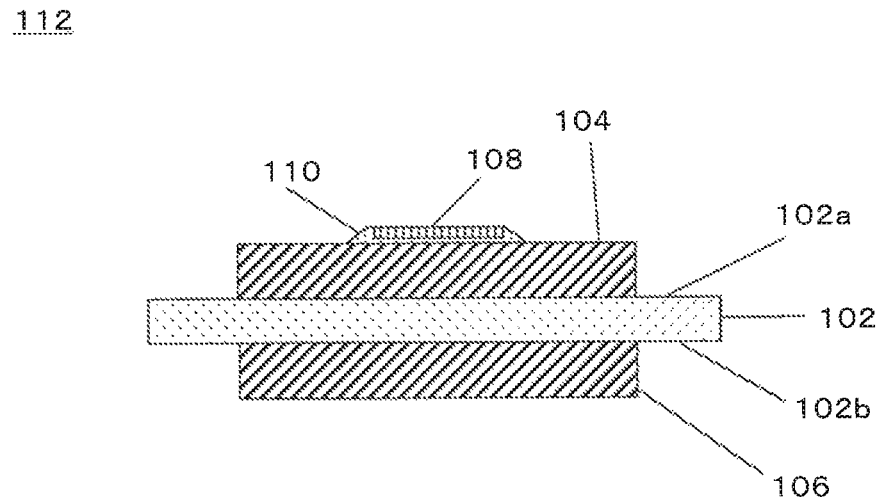
FIG. 3B is a vertical cross-sectional view showing a condition in which a power semiconductor is mounted on a first metal plate.
Figure 4:
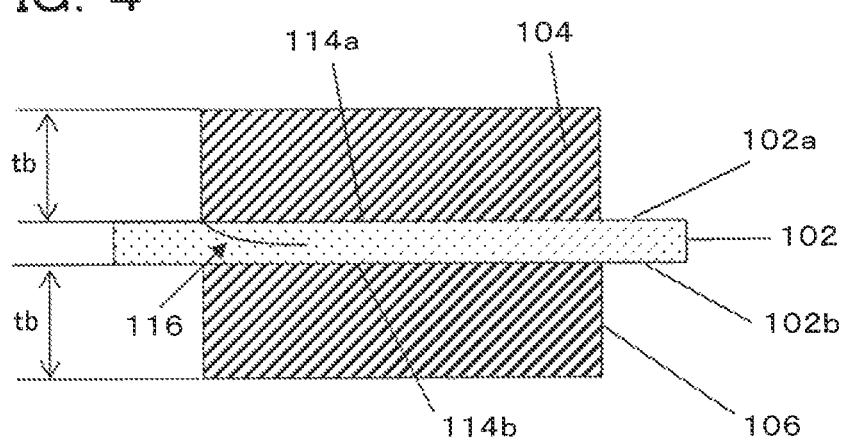
FIG. 4 is a schematic drawing showing a problem that occurs in the case that the thicknesses of the first metal plate and the second metal plate are increased in the ceramic circuit board according to the conventional technique.

A ceramic circuit board for evaluation according to Comparative Example 1 included a structure similar to that of the ceramic circuit board shown in FIG. 3B. More specifically, the first metal plate 104 was of a size in which the vertical and horizontal sides thereof were 25 mm×25 mm and the thickness thereof was 2 mm, whereas the second metal plate 106 was of a size in which the vertical and horizontal sides thereof were 25 mm×25 mm and the thickness thereof was 0.1 mm. Otherwise, features thereof were the same as those of Inventive Example 1, and ten of such evaluation samples according to Comparative Example 1 were prepared.

Comparative Example 2

An evaluation sample according to Comparative Example 2 included a structure similar to that of the ceramic circuit board shown in FIG. 3A. More specifically, the first metal plate 104 was of a size in which the vertical and horizontal sides thereof were 25 mm×25 mm and the thickness thereof was 2 mm, whereas the second metal plate 106 was of a size in which the vertical and horizontal sides thereof were 25 mm×25 mm and the thickness thereof was 2 mm. Otherwise, features thereof were the same as those of Inventive Example 1, and ten of such evaluation samples according to Comparative Example 2 were prepared.

<Evaluation>

First, as an evaluation method, a heat cycle test was carried out over a temperature range of −40° C. to 125° C. The number of cycles was 100 cycles. Per each cycle, the temperature was held at −40° C. (low temperature) for 30 minutes and at 125° C. (high temperature) for 30 minutes. Upon completion of the heat cycle test, the occurrence ratio of cracks in the bonding layer, and the occurrence ratio of cracks in the ceramic substrate were evaluated. More specifically, the occurrence ratio of cracks in the bonding layer was represented by, from among ten evaluation samples, the number of evaluation samples for which cracks were generated in the bonding layer 24 (bonding layer 110), whereas the occurrence ratio of cracks in the ceramic substrate was represented by, from among ten evaluation samples, the number of evaluation samples for which cracks were generated in the ceramic substrate 12 (ceramic substrate 102). In Table 1, the ratios are expressed by [The Number of Evaluation Samples in which Cracks were Generated]/[The Evaluation Sample Parameter (=10)]. The evaluation results are shown in the following Table 1.

TABLE 1

| | FIRST METAL PLATE | | SECOND METAL PLATE | | OCCURRENCE RATIO OF CRACKS IN BONDING LAYER | OCCURRENCE RATIO OF CRACKS IN CERAMIC SUBSTRATE |
|---|---|---|---|---|---|---|
| | Size (mm) | Thickness (mm) | Size (mm) | Thickness (mm) | | |
| EXAMPLE 1 | 35 × 35 | 2 | 25 × 25 | 0.1 | 0/10 | 0/10 |
| COMP. EXAMPLE 1 | 25 × 25 | 2 | 25 × 25 | 0.1 | 7/10 | 0/10 |
| COMP. EXAMPLE 2 | 25 × 25 | 2 | 25 × 25 | 2 | 0/10 | 8/10 |

(COMP. EXAMPLE means "COMPARATIVE EXAMPLE")

From Table 1, it can be understood that, in the evaluation samples according to Inventive Example 1, cracks were not generated in any of the bonding layers 24 and the ceramic substrates 12. This can be considered to have occurred because compressive stresses and tensile stresses accompanying thermal stress in the ceramic substrate 12 could be suppressed, and together therewith, the occurrence of warping could be suppressed, as a result of the fact that the size of the first metal plate 14 was larger than that of the ceramic substrate 12, and the size of the second metal plate 16 was smaller than that of the ceramic substrate 12.

In contrast thereto, in Comparative Example 1, although cracks did not occur in the ceramic substrate 12 in any of the evaluation samples, among the ten evaluation samples, cracks were generated in the bonding layer 110 in seven of the evaluation samples. In Comparative Example 2, although cracks did not occur in the bonding layer 110 in any of the evaluation samples, among the ten evaluation samples, cracks were generated in the ceramic substrate 12 in eight of the evaluation samples.

The ceramic circuit board and the electronic device according to the present invention are not limited to the aforementioned embodiments. Various alternative or additional structures may be adopted therein without deviating from the essential scope of the invention as set forth in the appended claims.

What is claimed is:

1. A ceramic circuit board comprising:
   a ceramic substrate; and
   a metal plate bonded to a front surface of the ceramic substrate,
   wherein a size of the front surface of the ceramic substrate is smaller than a size of a surface on a side of the metal plate that faces the ceramic substrate,
   wherein:
   a second metal plate is bonded to a rear surface of the ceramic substrate; and
   a size of the rear surface of the ceramic substrate is larger than a size of a surface on a side of the second metal plate that faces the ceramic substrate, and
   wherein the inequality $t2 < ta < t1$ is satisfied, where ta represents a thickness of the ceramic substrate, t1 represents a thickness of the metal plate, and t2 represents a thickness of the second metal plate.

2. The ceramic circuit board according to claim 1, wherein the ceramic substrate and the metal plate are bonded together, such that an entirety of the front surface of the ceramic substrate is included within the surface on the side of the metal plate that faces the ceramic substrate.

3. The ceramic substrate according to claim 1, wherein the second metal plate is bonded within the rear surface of the ceramic substrate at a position where the entire surface of the second metal plate that faces the ceramic substrate is included.

4. An electronic device comprising:
   the ceramic circuit board according to claim 1; and
   a power semiconductor, which is mounted on a surface of the metal plate of the ceramic circuit board.

* * * * *